US006867533B1

(12) United States Patent
Su et al.

(10) Patent No.: US 6,867,533 B1
(45) Date of Patent: Mar. 15, 2005

(54) MEMBRANE TENSION CONTROL

(75) Inventors: Ji Su, Highland Park, NJ (US); Joycelyn S. Harrison, Hampton, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/696,527

(22) Filed: Oct. 23, 2000

Related U.S. Application Data

(60) Provisional application No. 60/161,113, filed on Oct. 22, 1999.

(51) Int. Cl.$^7$ .............................................. H01L 41/08
(52) U.S. Cl. ...................................... 310/328; 310/800
(58) Field of Search ................................. 310/328, 800

(56) References Cited

U.S. PATENT DOCUMENTS

| | | | |
|---|---|---|---|
| 4,322,877 A | * 4/1982 | Taylor | 29/25.35 |
| 4,376,302 A | * 3/1983 | Miller | 310/358 |
| 4,578,613 A | 3/1986 | Posthuma de Boer et al. | |
| 4,810,913 A | * 3/1989 | Beauducel et al. | 310/324 |
| 4,868,447 A | 9/1989 | Lee et al. | |
| 4,879,698 A | * 11/1989 | Langberg | 310/348 |
| 5,410,210 A | * 4/1995 | Sato et al. | 310/332 |
| 5,440,320 A | 8/1995 | Lach et al. | |
| 5,977,685 A | * 11/1999 | Kurita et al. | 310/311 |
| 6,074,067 A | 6/2000 | Shimada | |
| 6,076,770 A | 6/2000 | Nygren et al. | |
| 6,098,349 A | 8/2000 | Zheng | |
| 6,131,698 A | 10/2000 | Reyland | |
| 6,624,551 B2 | * 9/2003 | Orten | 310/334 |
| 2001/0015597 A1 | * 8/2001 | Matsui et al. | 310/369 |

OTHER PUBLICATIONS

Kornbluh et al, "Electrostrictive polymer Artificial Muscle Actuators," May 1998 Proc. 1998 IEEE Int. Conf. on Robotics and Automation vol. 3. 2147–2154.*

Fukada, "History and Recent Progress in Piezoelectric Polymers." Nov. 2000 IEEE Trans. on Ultrasonics, Ferroelectrics, and Frequency Control vol. 47, No. 6. 1277–1290.*

Pelrine et al, "Electrostriction of Polymer Films for Microactuator", MEMS '97, Proceedings, IEEE., Tenth Annual International Workshop on , 1997 Page(s):238–243.*

Su et al, "Electrostrictive Graft Elastomers and Applications." 2000 Mat. Res. Soc. Symp. Proc. vol. 600. 131–136.*

Wang et al, "The Origins of Electromechanical Response in Polyurethan Elastomers." Jul. 1995 Int. Symp. on App. of Ferro. 182–185.*

Takashima et al, "The electrochemical actuaot using electrochemically–deposited poly–aniline film." Apr. 1995 Synthetic Metals vol. 71, 2265–2266.*

(List continued on next page.)

*Primary Examiner*—Thomas M. Dougherty
(74) *Attorney, Agent, or Firm*—Robin W. Edwards

(57) ABSTRACT

An electrostrictive polymer actuator comprises an electrostrictive polymer with a tailorable Poisson's ratio. The electrostrictive polymer is electroded on its upper and lower surfaces and bonded to an upper material layer. The assembly is rolled tightly and capped at its ends. In a membrane structure having a membrane, a supporting frame and a plurality of threads connecting the membrane to the frame, an actuator can be integrated into one or more of the plurality of threads. The electrostrictive polymer actuator displaces along its longitudinal axis, thereby affecting movement of the membrane surface.

30 Claims, 3 Drawing Sheets

OTHER PUBLICATIONS

Pelrine et al, "Electrostriction of Polymer Films for Microactuators." Jan. 1997 Proc. 1997 IEEE Int. Workshop on Micro Electro Mechanical Systems. 238–243.*

Y. Bar–Cohen et al, "NASA/JPL Workshop on Biomorphic Explorers for Future Missions", held at Jet Propulsion Labs, Pasadena, CA, Aug. 19–20, 1998, 22 pgs.

Y. Bar–Cohen et al, SPIE Proceedings, Newport Beach, CA, Paper No. 3669–05, 1999, 6 pgs.

Web page (http://members.aol.com/rhoadkyll2/scifeb1.text, Jul. 25, 2000, 2 pgs.

Y. Bar–Cohen et al., "Electroactive polymers (EAP) low mass musscle actuators", SPIE International Conference, Smart Structures and Materials Symposium, Enabling Technologies: Smart Structures and Integrated Systems, San Diego, CA Mar. 3–6, 1997, 6 pgs.

Y. Bar–Cohen et al., "Flexible, low mass robotic arm actuated by electroactive polymers", SPIE 5th Annual International Symposium on Smart Structures and Materials, Mar. 1–5, 1998, 5 pgs.

* cited by examiner

MEMBRANE TENSION CONTROL

CLAIM OF BENEFIT OF PROVISIONAL APPLICATION

Pursuant to 35 U.S.C. §119, the benefit of priority from provisional application 60/161,113, with a filing date of Oct. 22, 1999, is claimed for this non-provisional application.

CROSS REFERENCE TO RELATED CASES

This application is related to co-pending commonly owned patent application Ser. No. 09/696,528, filed Oct. 23, 2000, entitled "Electrostrictive Graft Elastomers."

ORIGIN OF THE INVENTION

The invention described herein was made by an employee of the United States Government and a National Research Council Research Associate and may be used by or for the Government for governmental purposes without the payment of any royalties thereon or therefor.

BACKGROUND OF THE INVENTION

1. Field of the Invention

The present invention is generally related to tension control of membranes using an electroactive actuator having at least predominantly single axis displacement.

2. Description of the Related Art

Membrane inflatable and deployable space structures are widely employed by the government and commercially as reflectors, antennas, solar arrays, satellites, solar sails, etc. Although these membrane inflatable and deployabe structures are widely used, many challenges exist which limit their performance for high precision applications. Factors affecting precision include surface smoothness, deviation from desired surface profile, surface deformations due to thermal fluctuations, and accurate membrane positioning. Actuation devices are used for many applications, including the shaping, tuning, positioning, controlling and deforming of membrane structures. To operate most effectively in the aforementioned applications, actuation devices require sufficient force and strain, and often need to produce complex motions.

Conventional piezoelectric ceramic, polymer, and composite actuators (including piezoelectric, electrostrictive, and electrostatic) lack the combination of sufficient strain and force to most effectively perform the aforementioned functions. Previous concepts for shaping and tuning membrane structures have primarily involved the use of piezoelectric ceramic materials. These ceramic piezoelectrics have the major problems of large mass, high density, low strain and high brittleness. Generally, piezoceramics also need additional mechanical devices to achieve a shaping, tuning, positioning, controlling or deforming function. In contrast to electroceramics, electroactive polymers are emerging as new actuation materials due to their enhanced strain capabilities.

Tension control of membranes, using electrostrictive polymer actuators exhibiting at least predominantly single axis displacement and having sufficient force and strain, to smooth local surface wrinkles which may result from thermal distortions and other sources is desirable and currently lacking in the related art.

SUMMARY OF THE INVENTION

Accordingly, an object of the present invention is to provide an electroactive tension control device.

Another object is to provide an electroactive tension control device wherein the electroactive components have small mass, low density, high strain and low brittleness.

Another object is to provide an electroactively controlled inflatable membrane.

Another object is to provide an electroactive tension control device using electrostrictive polymer actuators.

Another object is to provide an electrostrictive polymer actuator exhibiting displacement along a longitudinal axis when electrically activated.

Additional objects and advantages of the present invention are apparent from the drawings and specification that follow.

In accordance with the present invention, an electrostrictive polmer actuator comprises an electrostrictive polymer with a tailorable Poisson's ratio. The electrostrictive polymer is electroded on its upper and lower surfaces and bonded to an upper material layer. The assembly is rolled tightly and capped at its ends. In a membrane structure having a membrane, a supporting frame and a plurality of threads connecting the membrane to the frame, an actuator can be integrated into one or more of the plurality of threads. The electrostrictive polymer actuator displaces along its longitudinal axis, thereby affecting movement of the membrane surface.

BRIEF DESCRIPTION OF THE DRAWINGS

A more complete appreciation of the invention and the many of the attendant advantages thereof will be readily attained as the same becomes better understood by reference to the following detailed description when considered in connection with the accompanying drawings, wherein.

DETAILED DESCRIPTION OF THE INVENTION

Figure 1:
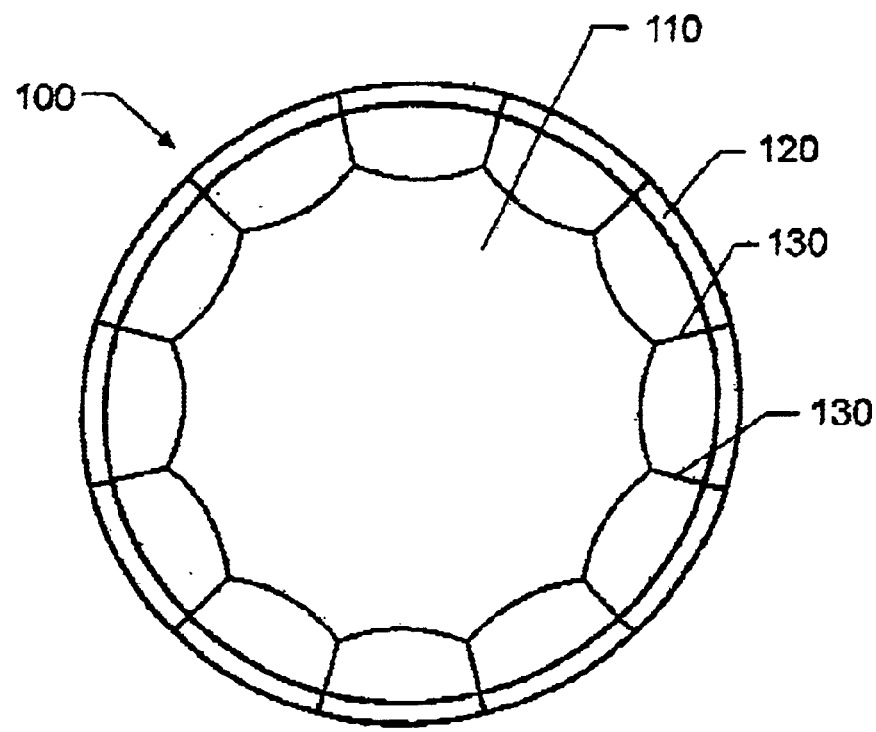
FIG. 1 illustrates a prior art membrane structure.
Figure 2:
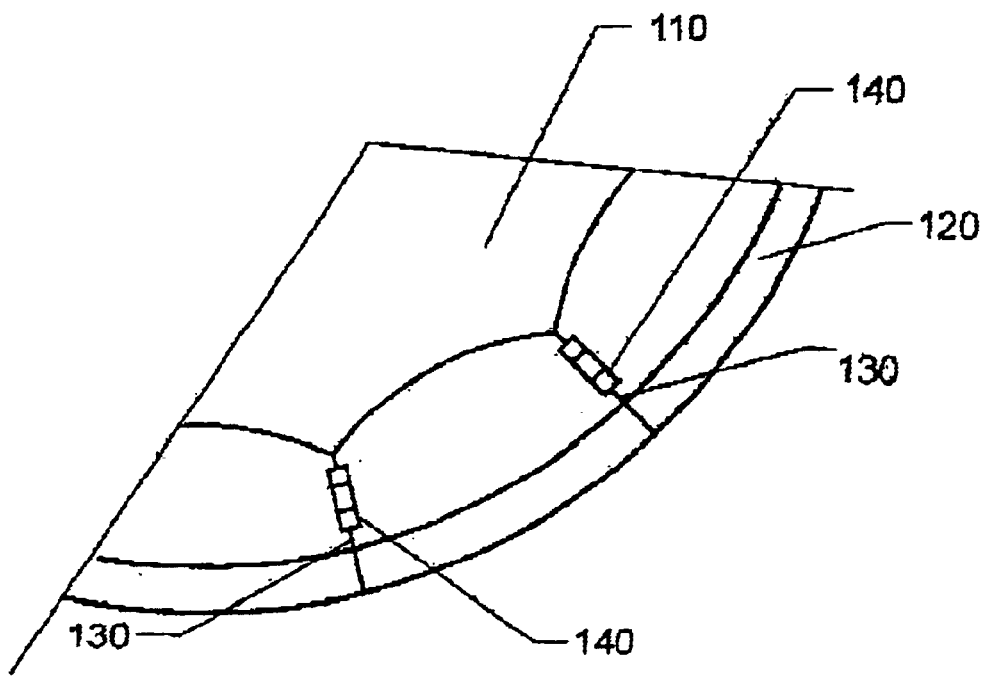
FIG. 2 illustrates the present invention, including tension control actuators integrated into the membrane structure.

Referring now to the drawings, and more particularly to FIG. 1, a prior art multifunctional membrane structure is shown and referenced generally by the numeral 100. Membrane 110 is connected to supporting frame 120 by threads 130. The threads 130 are generally a metallic material. FIG. 1 is a general representation of a membrane structure; however, the exact shape of the membrane and supporting structure may vary from that shown. FIG. 2 illustrates electrostrictive polymer actuators 140 integrated into threads 130. The actuators 140 expand or contract along the axis of the threads, thereby increasing or decreasing tension in the threads to make local adjustments to maintain the membrane surface in working condition. An actuator 140 can be integrated into one or more threads 130 as desired.

Figure 3A:
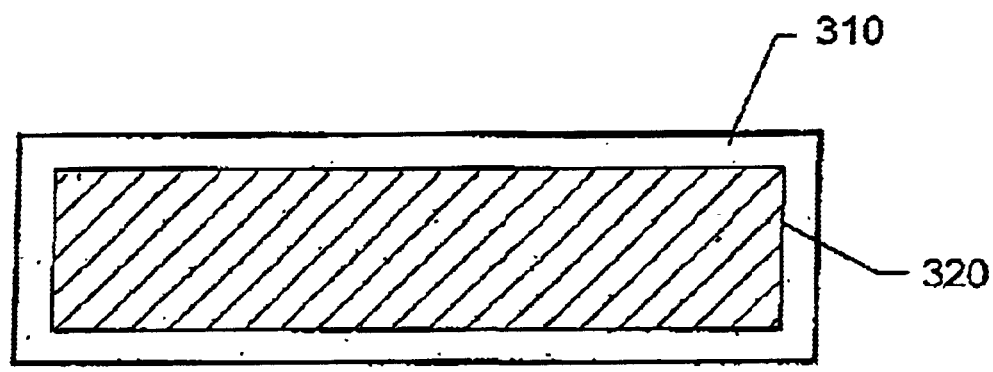
FIGS. 3A and 3B illustrate the actuator layers.
Figure 3B:
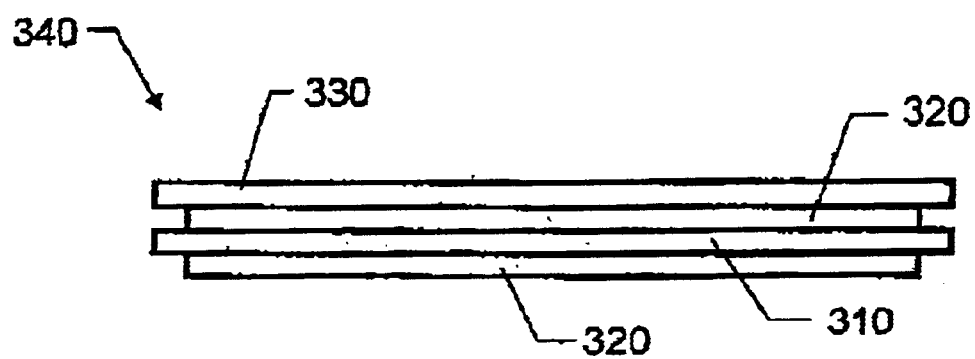

Referring now to FIGS. 3A and 3B, actuator 140 comprises layer 310 of an electrostrictive polymer material having a tailorable Poisson's ratio. The strain in layer 310 increases in one direction as Poisson's ratio tends to zero. Any deviation of Poisson's ratio away from zero will produce off-axis displacement. Such off-axis displacement is preferably minimized. A Poisson's ratio of zero provides the especially preferred single axis displacement. A preferred material is the electrostrictive graft elastomer described and claimed in "Electrostrictive Graft Elastomers", Ser. No. 09/696,528, filed Oct. 23, 2000, hereby incorporated by reference. The Poisson's ration is tailored via crystal orientation. Layer 310 is electroded 320 on both its upper and lower surfaces. The electrodes 320 can be single surface electrodes or interdigitated electrodes. An interdigitated electrode configuration allows additional options to vary drive voltage to the electrodes depending on the electrode spacing of a particular design. Suitable materials for the electrodes are conductive polymers, such as polypyrrole or ployaniline, or soft materials, such as gold. The surface of layer 310 that is electroded is maximized. Layer 330 is bonded to the upper electroded layer 310. A suitable bonding material is a chemical adhesive, such as epoxy. It is preferred for layer 330 to be of the same material as layer 310 so that layer 310 can function as either an active or inactive layer depending on whether it is electrically activated. If a different material is used for layer 330, it must be an insulator. The surface area and thickness of the various layers will vary depending upon specific response requirements.

Figure 4A:
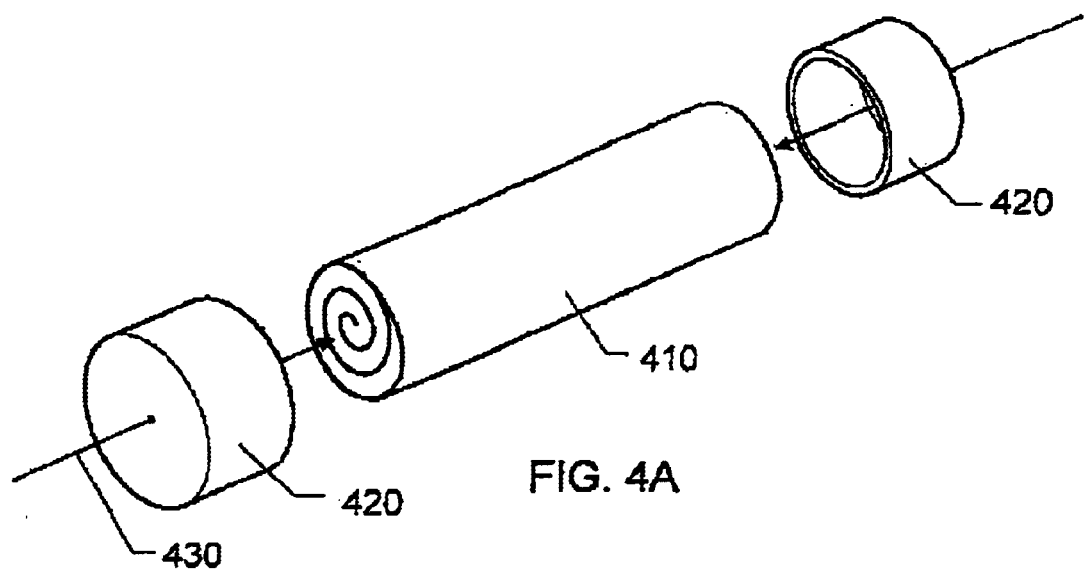
FIGS. 4A and 4B illustrate the actuator in its rolled state.
Figure 4B:
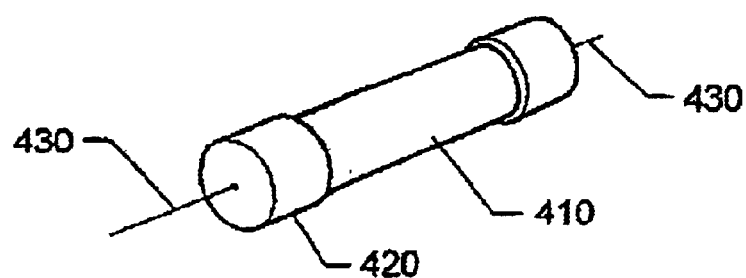
Figure 4C:
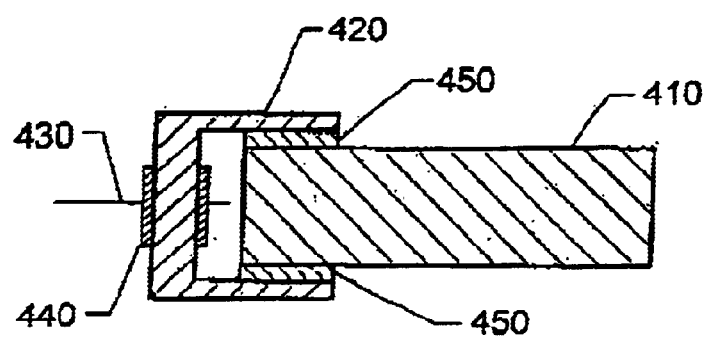
FIG. 4C is a cross-sectional view of FIG. 4B illustrating greater detail of the cap attachment.

The bonded layers, denoted generally by numeral 340 are tightly rolled, as illustrated in the exploded view of FIG. 4A, so that there is entire surface contact throughout the roll 410. The overall size of the rolled configuration will depend upon the specific response requirements. The caps 420 are affixed onto both ends of the roll 410, as shown in FIG. 4B. The caps 420 maintain the roll 410 in its rolled configuration and also connect the roll 410 to the threads 430. The caps 420 are insulated metal or plastic, with plastic being preferred. Referring to FIG. 4C, cap 420 is affixed to the roll 410 by chemical or mechanical bonding means. The preferred bonding means is a chemical adhesive that is cast and cured at room temperature and is compatible with the materials being bonded, such as epoxy. The cap 420 overlaps the roll 410 to the extent necessary to achieve sufficient bonding. The threads 430 are attached to the cap 420 using chemical or mechanical means. Illustrated in FIG. 4C is a mechanical means 440 affixing the thread 430 to the cap 420. The cap 420 is bonded 450 to the roll 410. Again referring to FIG. 1, the longitudinal axis of each actuator 140 is substantially aligned with the direction of the thread 130 within which it is integrated. In operation, the actuators 140 respond to the output of sensors located on membrane 110 via an integrated feedback control system.

Obviously, numerous additional modifications and variations of the present invention are possible in light of the above teachings. It is therefore to be understood that within the scope of the appended claims, the invention may be practiced otherwise than is specifically described herein.

What is claimed is:

1. A membrane structure, comprising:
   a membrane whose position is to be controlled;
   a supporting frame;
   a plurality of threads connecting the membrane to the supporting frame; and
   an electrostrictive polymer actuator integrated into at least one thread, the electrostrictive polymer actuator having a longitudinal axis that is substantially aligned with the axis of the thread;
   wherein the electrostrictive polymer actuator displaces along its longitudinal axis, thereby affecting movement of the membrane surface.

2. The structure of claim 1, wherein the electrostrictive polymer actuator contracts.

3. The structure of claim 1, wherein the electrostrictive polymer actuator expands.

4. The structure of claim 1, wherein displacement of the electrostrictive polymer actuator affects tension in the thread.

5. The structure of claim 4, wherein tension in the thread affects tension of the membrane.

6. A membrane structure, comprising:
   a membrane whose position is to be controlled;
   a supporting frame;
   a plurality of threads connecting the membrane to the supporting frame; and
   an electrostrictive polymer actuator integrated into at least one thread, the electrostrictive polymer actuator having a longitudinal axis that is substantially aligned with the axis of the thread;
   wherein the electrostrictive polymer actuator displaces along its longitudinal axis, thereby affecting movement of the membrane structure; and
   wherein the electrostrictive polymer actuator comprises:
   an electrostrictive polymer having a tailorable Poisson's ratio, wherein the electrostrictive polymer is electroded on its upper and lower surfaces;
   an upper material layer bonded to the upper electroded surface of the electrostrictive polymer, wherein the electroded electrostrictive polymer and upper material layer form a bonded assembly, wherein the bonded assembly is rolled into a roll having two ends, and further wherein entire adjacent surfaces within the roll contact one another; and
   a cap affixed to each end of the roll.

7. The structure of claim 6, wherein the electrostrictive polymer comprises an electrostrictive graft elastomer comprising a backbone molecule which is a non-crystallizable, flexible macromolecular chain, and a grafted polymer forming polar graft moieties with backbone molecules, the polar graft moieties having been rotated by an applied electric field and sustained in the rotated state until the electric field is removed.

8. The structure of claim 6, wherein the electrostrictive polymer is electroded with a conductive polymer.

9. The structure of claim 6, wherein the electrostrictive polymer is electroded with a soft metal.

10. The structure of claim 6, wherein the electrostrictive polymer is electroded with materials selecting from the group consisting of polypyrrole, polyaniline, and gold.

11. The structure of claim 6, wherein the electrostrictive polymer is electroded with single surface electrodes.

12. The structure of claim 6, wherein the electrostrictive polymer is electroded with interdigitated electrodes.

13. The structure of claim 6, wherein the upper material layer is selected from the group consisting of insulator and electrostrictive polymer.

14. The structure of claim 6, wherein the upper material layer is an electrostrictive polymer having a tailorable Poisson's ratio.

15. The structure of claim 6, wherein the cap is selected from the group consisting of plastic and insulated metal.

16. The structure of claim 6, wherein the cap is affixed to the end of each roll by means selected from the group consisting of chemical and mechanical.

17. The structure of claim 6, wherein the cap is affixed to the end of each roll by epoxy bonding.

18. The structure of claim 6, wherein the thread is affixed to the cap by mechanical means.

19. An electrostrictive polymer actuator, comprising:
   an electrostrictive polymer having a tailorable Poisson's ratio, wherein the electrostrictive polymer is electroded on its upper and lower surfaces;

an upper material layer bonded to the upper electroded surface of the electrostrictive polymer, wherein the electroded electrostrictive polymer and upper material layer form a bonded assembly, wherein the bonded assembly is rolled into a roll having two ends, and further wherein entire adjacent surfaces within the roll contact one another; and a cap affixed to each end of the roll.

20. The structure of claim 19, wherein the electrostrictive polymer comprises an electrostrictive graft elastomer comprising a backbone molecule which is a non-crystallizable, flexible macromolecular chain, and a grafted polymer forming polar graft moieties with backbone molecules, the polar graft moieties having been rotated by an applied electric field and sustained in the rotated state until the electric field is removed.

21. The structure of claim 19, wherein the electrostrictive polymer is electroded with a conductive polymer.

22. The structure of claim 19, wherein the electrostrictive polymer is electroded with a soft metal.

23. The structure of claim 19, wherein the electrostrictive polymer is electroded with materials selecting from the group consisting of polypyrrole, polyaniline, and gold.

24. The structure of claim 19, wherein the electrostrictive polymer is electroded with single surface electrodes.

25. The structure of claim 19, wherein the electrostrictive polymer is electroded with interdigitated electrodes.

26. The structure of claim 19, wherein the upper material layer is selected from the group consisting of insulator and electrostrictive polymer.

27. The structure of claim 19, wherein the upper material layer is an electrostrictive polymer having a tailorable Poisson's ratio.

28. The structure of claim 19, wherein the cap is selected from the group consisting of plastic and insulated metal.

29. The structure of claim 19, wherein the cap is affixed to the end of each roll by means selected from the group consisting of chemical and mechanical.

30. The structure of claim 19, wherein the cap is affixed to the end of each roll by epoxy bonding.

* * * * *